United States Patent
Motoyama et al.

(10) Patent No.: US 11,244,853 B2
(45) Date of Patent: Feb. 8, 2022

(54) FULLY ALIGNED VIA INTERCONNECTS WITH PARTIALLY REMOVED ETCH STOP LAYER

(71) Applicant: International Business Machines Corporation, Armonk, NY (US)

(72) Inventors: Koichi Motoyama, Clifton Park, NY (US); Kenneth Chun Kuen Cheng, Albany, NY (US); Chanro Park, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/856,954

(22) Filed: Apr. 23, 2020

(65) Prior Publication Data

US 2021/0335659 A1    Oct. 28, 2021

(51) Int. Cl.
*H01L 21/768* (2006.01)
*H01L 23/522* (2006.01)

(52) U.S. Cl.
CPC .. *H01L 21/76807* (2013.01); *H01L 21/76841* (2013.01); *H01L 23/5226* (2013.01)

(58) Field of Classification Search
CPC ......... H01L 21/76807; H01L 21/76808; H01L 21/7681; H01L 21/76811; H01L 21/76813; H01L 21/76841; H01L 21/76829; H01L 21/76832; H01L 21/76834
See application file for complete search history.

(56) References Cited

U.S. PATENT DOCUMENTS

| | | | |
|---|---|---|---|
| 6,235,628 B1 | 5/2001 | Wang et al. | |
| 8,614,144 B2 | 12/2013 | Kato | |
| 9,324,650 B2 | 4/2016 | Edelstein et al. | |
| 9,806,023 B1 | 10/2017 | Briggs et al. | |
| 9,859,208 B1 | 1/2018 | Angyal et al. | |
| 9,953,865 B1 | 4/2018 | Briggs et al. | |
| 10,032,643 B2 | 7/2018 | Chawla et al. | |
| 10,256,191 B2 | 4/2019 | Briggs et al. | |
| 10,312,188 B1 | 6/2019 | Srivastava et al. | |
| 2009/0072400 A1 | 4/2009 | Zhu et al. | |
| 2017/0178951 A1* | 6/2017 | Ting | H01L 21/76816 |
| 2018/0315654 A1 | 11/2018 | Briggs et al. | |
| 2019/0019726 A1 | 1/2019 | Ryan et al. | |
| 2019/0326170 A1 | 10/2019 | Backes et al. | |
| 2019/0385910 A1 | 12/2019 | Lai et al. | |

OTHER PUBLICATIONS

Briggs, et al., Fully Aligned Via Integration for Extendibility of Interconnects to Beyond the 7 nm Node; IEEE 2017, Dec. 2017, pp. 14.2.1 to 14.2.4.

* cited by examiner

*Primary Examiner* — Thanhha S Pham
(74) *Attorney, Agent, or Firm* — L. Jeffrey Kelly; Otterstedt, Wallace & Kammer, LLP

(57) ABSTRACT

A dual damascene interconnect structure with a fully aligned via integration scheme is formed with a partially removed etch stop layer. Portions of the etch stop layer are removed prior to dual damascene patterning of an interlevel dielectric layer formed above metal lines and after such patterning. Segments of the etch stop layer remain only around the vias, allowing the overall capacitance of the structure to be reduced.

10 Claims, 9 Drawing Sheets

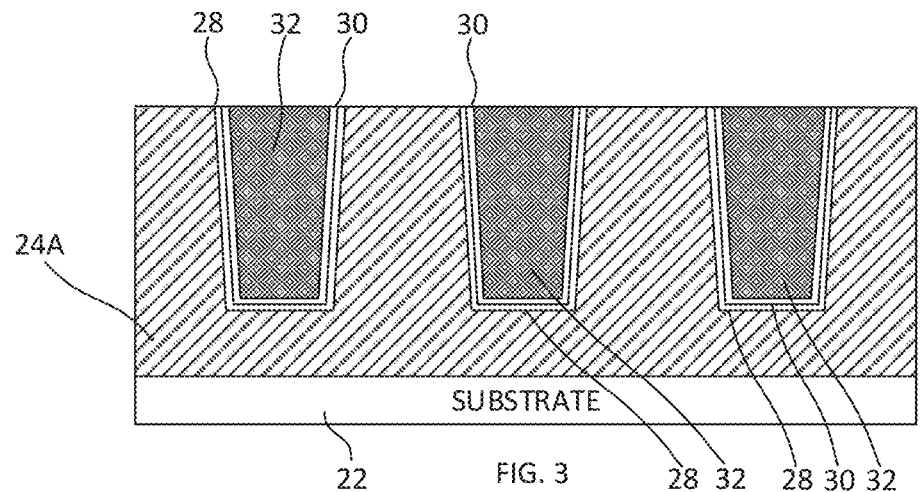
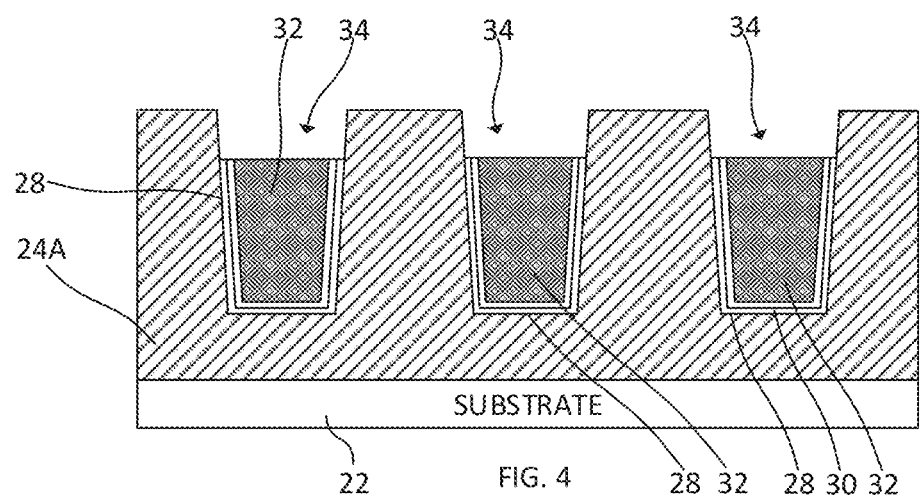

FULLY ALIGNED VIA INTERCONNECTS WITH PARTIALLY REMOVED ETCH STOP LAYER

BACKGROUND

The present invention relates generally to the electrical, electronic and computer arts and, more particularly, to fully aligned via (FAV) interconnect structures and their fabrication.

Silicon-based devices typically include multiple interconnect metallization layers above a device layer (front-end-of-line/FEOL) that contains field-effect transistors (FETs) or other structures. FEOL processing includes high-temperature steps for manipulating semiconductor conductivity. Middle-of-line (MOL) processing includes steps typically used for fabricating metal contacts for logic circuitry components, such as field-effect transistors (FETs), resistors, diodes, and capacitors. MOL processing includes intermediate-temperature steps for forming semiconductor-metal compounds (silicides, germanosilicides) for electrical contacts. Back-end-of-line (BEOL) processing involves the creation of metal interconnecting wires, which connect the devices formed in FEOL processing to form electrical circuits.

In BEOL processing, the metal lines including the interconnecting wires are deposited in sequence (e.g. M1, M2, M3, etc.) above the FEOL layer, and include dielectric layers with trenches, and vias therein, that are filled with electrical conductors. Trench openings are conventionally formed in the dielectric layer by using, for example, known damascene or dual damascene techniques. M2 and M3 lines may have wider pitches than the M1 line. The interconnecting wires within each metal line are electrically connected to interconnecting wires in other metal lines and to the devices in the FEOL layer. BEOL processing includes low-temperature steps for forming metal wires and preserving temperature-sensitive FEOL and MOL structures. Narrow metal lines are required for some applications.

BEOL processing involves the formation of interconnects above the MOL layers. A chip may have multiple BEOL interconnect layers. Each layer, which has a wiring scheme, is connected to another layer by vias. Damascene copper wires are often chosen to reduce the wire resistance due to superior electrical conductivity of copper. The wires are formed within dielectric layers including low-k material. The dual-damascene process is characterized by patterning vias and trenches such that the metal deposition fills both at the same time. FAVs can enable a relatively small BEOL pitch; for example, 32 nm or less, and may be effective to reduce via resistance by maximizing the contact area between the via and the metal line below. Enhanced Vbd (breakdown voltage) is expected due to increased distance between a via and an adjacent line.

BRIEF SUMMARY

Interconnect structures having fully aligned vias are formed with partially removed etch stop layers.

In one aspect, a method of forming an interconnect structure includes depositing a conformal dielectric etch stop layer over an initial structure. The initial structure includes a substrate, a bottom interlevel dielectric layer located outward of the substrate and defining a plurality of trenches, and a plurality of metal lines partially filling the trenches. A further step includes removing portions of the conformal dielectric etch stop layer adjacent a first subset of the metal lines for which vias are not to be formed. The removal forms etch stop segments from the conformal dielectric etch stop layer, and the etch stop segments are located adjacent a second subset of the metal lines where vias are to be formed. Further steps include depositing a top interlevel dielectric layer over the bottom interlevel dielectric layer, the metal lines, and the etch stop segments; and dual damascene patterning the top interlevel dielectric layer. This patterning forms one or more top trenches within the top dielectric layer and one or more vias extending downwardly from each of the one or more top trenches. The vias are vertically aligned with the second subset of the metal lines. Still further steps include removing portions of the etch stop segments adjacent the second subset of the metal lines; and depositing interconnect metal within the one or more top trenches, the one or more vias, and the trenches containing the second subset of the metal lines. The interconnect metal is electrically connected to the second subset of the metal lines within the first interlevel dielectric layer.

In another aspect, a structure includes a semiconductor substrate; and an interlevel dielectric layer over the semiconductor substrate. The interlevel dielectric layer includes a bottom level and a top level above the bottom level. The structure also includes first and second subsets of metal lines extending within the bottom level of the interlevel dielectric layer; and vertically extending vias, located within the top level of the interlevel dielectric layer, and aligned with the second subset of the metal lines. The structure still further includes a metal interconnect layer extending through the vertically extending vias, which is electrically connected to the second subset of the metal lines; and a plurality of discrete etch stop segments separated from each other by portions of the interlevel dielectric layer. Each of the vias extends, respectively, through an opening in one of the etch stop segments, and the etch stop segments are adjacent the second subset of the metal lines but not the first subset of the metal lines.

In still another aspect, an exemplary method includes encoding, into a design structure embodied on a non-transitory computer-readable medium, a design for an integrated circuit. The design structure specifies a design for an exemplary structure as discussed just above. The method further includes specifying, within the design structure, a horizontal extent for the discrete etch stop segments which limits parasitic capacitance of the discrete etch stop segments to no more than a predetermined capacitance value; specifying, within the design structure, a distance between the vertically extending vias and the first subset of the metal lines, which enhances breakdown voltage to at least a predetermined minimum voltage value; and specifying, within the design structure, a contact area between the vias and the second subset of metal lines which limits via resistance to no more than a predetermined resistance value.

Techniques and structures as disclosed herein can provide substantial beneficial technical effects. By way of example only and without limitation, one or more embodiments may provide one or more of the following advantages:

Improvement in TDDB (time dependent dielectric breakdown) properties;
Reduction in via resistance using FAVs;
Reduced overall capacitance.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 3 is a schematic, cross-sectional view showing the structure of FIG. 2 following planarization of the metal fill layer;

FIG. 4 is a schematic, cross-sectional view thereof following recessing of the metal fill layer;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Dual damascene interconnects with fully aligned vias (FAVs) can minimize alignment issues and improve reliability; for example, TDDB (time dependent dielectric breakdown) and performance. Fully aligned via integration schemes may require formation of an etch stop layer within low-k dielectric materials.

FAV structures often have nanoscopic dimensions. A structure or space having nanoscopic dimensions, such as a via or trench, includes one or more dimensions less than one hundred nanometers. The height and width of trenches in interconnect structures can both be less than one hundred nanometers. The reliability of FAV interconnects is generally governed by the properties of the dielectric material between metal lines. The presence of an etch stop layer within the dielectric material may cause an undesirable overall capacitance increase in FAV interconnect structures. A dual damascene FAV structure having improved reliability is obtained by removing portions of the etch stop layer that would otherwise remain within the interlevel dielectric (ILD) layer. The only portions of the etch stop layer remaining in the FAV structure are those around the vias. The overall capacitance of an FAV interconnect structure should accordingly be reduced. As will be appreciated by the skilled artisan, the capacitance, C, of a parallel plate capacitor is given by $C=\varepsilon A/d$, where c is the permittivity of the dielectric, A is the area, and d is the distance between the plates. With constant d and permittivity, decreasing A (e.g. area of the etch stop layer, which acts as a plate) will lower the capacitance C.

Figure 1:
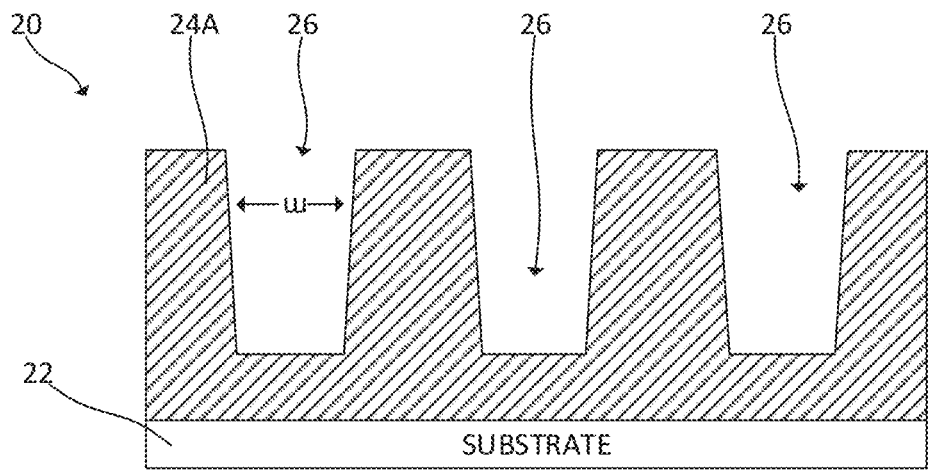
FIG. 1 is a schematic, cross-sectional view showing a patterned interlayer dielectric layer formed over a device wafer.

A monolithic structure 20 shown in FIG. 1 is obtained following FEOL processing and formation of a patterned interlevel dielectric (ILD) layer 24A over a substrate 22. Interconnect line/via patterns are conventionally formed in the ILD layer 24A by using, for example, known damascene techniques. A patterning stack including hard masks and lithographic masks is formed on the ILD layer followed by etching steps. Specifically, a photoresist (not shown) may be applied over the ILD layer. The photoresist can be applied by any suitable technique, including, but not limited to coating or spin-on techniques. A mask (not shown), which is patterned with shapes defining trench openings and/or possibly vias to be formed, is provided over the photoresist, and the mask pattern is transferred to the photoresist using a photolithographic process, which creates recesses in the uncovered regions of the photoresist.

The patterned photoresist is subsequently used to create the same pattern of trenches 26 in the ILD layer 24A through conventional etching typically used for forming trenches and contact holes. Dry etch techniques (for example, a reactive ion etch) may be employed to form such horizontally extending trenches, as well as vias (not shown in FIG. 1) extending vertically downwardly from the trenches. The etching selectively removes a portion of the ILD layer 24A. The depth(s) of the trench openings or other holes can be controlled by using a timed etching process. Alternatively, the dielectric layer 24A may include multiple layers that may be selectively etched. In such a case, the etch process selectively removes the upper layer(s) of the multi-layer ILD layer, stopping at a lower layer of the multi-layer ILD layer, which forms an etch stop. After formation of trench openings and/or vias, the photoresist may be stripped by ashing or other suitable process from the ILD layer. The resulting structure 20 may be subjected to a wet clean. In an exemplary embodiment, the trenches 26 have average width dimensions (w) of 50 nm or less. In a further exemplary embodiment, the trenches have an average width of 18 nm or less. The sidewalls of the trenches 26 may converge inwardly from top to bottom.

The ILD layer 24A may be deposited on the substrate 22 using, for example, deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. The ILD layer 24A may include, but is not limited to, low-k materials (e.g., k less than about 4.0), such as, for example, porous silicates, carbon doped oxides, silicon dioxides, silicon oxynitrides, carbon-doped silicon oxide (SiCOH) and porous variants thereof, silsesquioxanes, siloxanes, or other dielectric materials. Such materials can have, for example, a dielectric constant in the range of about 2 to about 4. The ILD layer 24A may have a vertical thickness ranging from about 20 nm to about 200 nm.

In some cases, the ILD layer 24A is an SiCOH dielectric film having a dielectric constant (k) of about 2.7-2.8 can. Such a dielectric film can be deposited using PECVD. The dielectric material chosen for the ILD layer 24A, for example SiCOH, should exhibit satisfactory time dependent dielectric breakdown (TDDB) reliability. Time dependent dielectric breakdown involves the loss of insulating properties of a dielectric when it its subjected to voltage/current bias and temperature stress. It may be indicated by an increase in the leakage current when under constant bias stress at elevated temperature. Various tests are known for determining the reliability of low-k dielectrics such as carbon doped silicon oxide.

A further stage in the fabrication process includes depositing conformal layer(s) of liner material(s) on the patterned dielectric layer 24A. The sidewalls and bottom surfaces of the trenches 26 and/or other openings within the ILD layer 24A are lined with layer(s) of electrically conductive materials. The liner material may include one or more thin layers of material such as, for example, tantalum (Ta), tantalum nitride (TaN), titanium nitride (TiN), cobalt (Co), ruthenium (Ru), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, NiMoB which are suitable for the given application. The thin liner serves as a barrier diffusion layer and adhesion layer. The conformal layer of liner material is deposited using known techniques such as CVD, ALD, or PVD.

Figure 2:
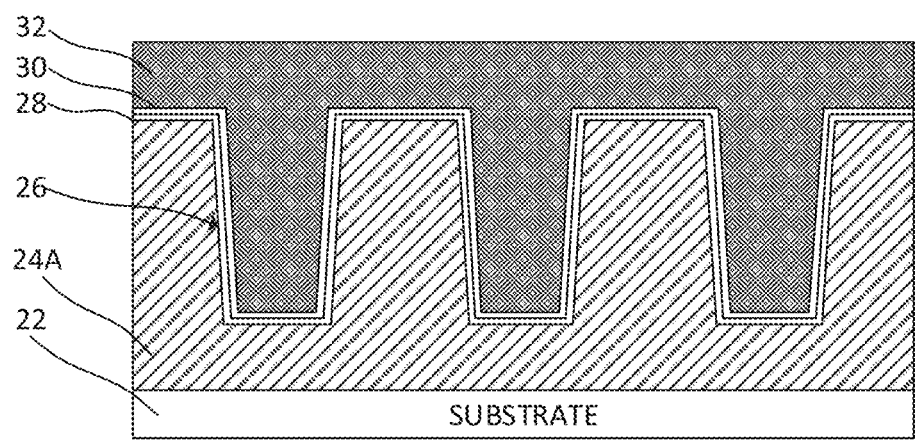
FIG. 2 is a schematic, cross-sectional view showing the structure of FIG. 1 following deposition of a barrier, a metal liner and a metal fill layer.

Referring now to FIG. 2, in an exemplary embodiment, a barrier layer 28 including TaN or TiN is deposited directly on the ILD layer 24A and a metal liner 30 including cobalt or ruthenium is deposited on the barrier layer 28. A thin conformal copper (Cu) seed layer can be deposited over the surface of the metal liner using PVD, followed by the electroplating of Cu to fill the damascene (or dual damascene) openings in the ILD layer 24A, including the trenches 26 in the exemplary structure depicted in FIG. 1. A thermal anneal stage follows electroplating. In one example, cobalt is present in thin layers as a metal liner layer (e.g., 1 to 100 angstroms) between a TaN barrier layer and a Cu fill layer. FIG. 2 schematically illustrates an exemplary structure including a barrier layer 28, a metal liner 30 and a metal fill layer 32. The deposited layers 28, 30, 32 form metal lines that extend horizontally within the first ILD layer 24A. The metal lines may be electrically connected to electronic devices (not shown) formed on the semiconductor substrate 22 or to intermediate wiring layers (not shown).

The overburden barrier, liner, seed, and metallization materials may then be removed by performing a multi-step chemical mechanical polishing process (CMP) to planarize the surface of the semiconductor structure down to the ILD layer 24A. This results in a structure as illustrated in FIG. 3. Referring to FIG. 4, portions of the metal fill layer 32 are recessed using, for example, SC1/dHF (diluted hydrofluoric acid). As an alternative to using SC1/dHF, the metal fill layer 32 may recessed by wet etches, including chemistries having an oxidizer such as, for example, hydrogen peroxide. Portions of the metal liner 30 can be removed at the same time as the metal fill layer. Resulting recesses 34 in the metal form relatively shallow, nanoscopic trenches (compared to the originally formed trenches 26) in the ILD layer 24A (i.e., above the top surfaces of the recessed metal). The shallow, nanoscopic trenches 34 have about one quarter to one third the depth of the trenches 26 formed in the ILD layer 24A in some exemplary embodiments. Such depth dimensions are not considered critical and may, for example, be in the range of five percent to seventy percent of the depth of the originally formed trenches 26.

The metal fill layer 32 is recessed selective to the barrier layer and to the ILD layer 24A. Still referring to FIG. 4, after recessing of the metal fill layer and removal of the adjoining top portions of the metal liner 30, exposed portions of the barrier layer 28 (e.g., TaN) can be removed The removal of the barrier layer 28 is selective to the metal fill layer 32 and the dielectric layer 24A. According to an embodiment of the present invention, the barrier layer is selectively etched using, for example, 15% $H_2O_2$ (hydrogen peroxide)+10 g/L (grams/liter) BTA (Benzotriazole)+0.5 g/L CDTA (cyclohexanediamininetetraaceticacid)+KOH (potassium hydroxide) in deionized (DI) water at a pH in the range of about 4 to about 12. Etching can be performed at a temperatures ranging from about 25 degrees C. to about 70 degrees C. Other possible variations for etch chemistry include, but are not necessarily limited to, replacing KOH by another alkaline metal hydroxide, replacing hydrogen peroxide by another compound containing one or more peroxy groups, replacing CDTA by another peroxide stabilizer, and/or replacing BTA by another corrosion inhibitor.

Figure 5:
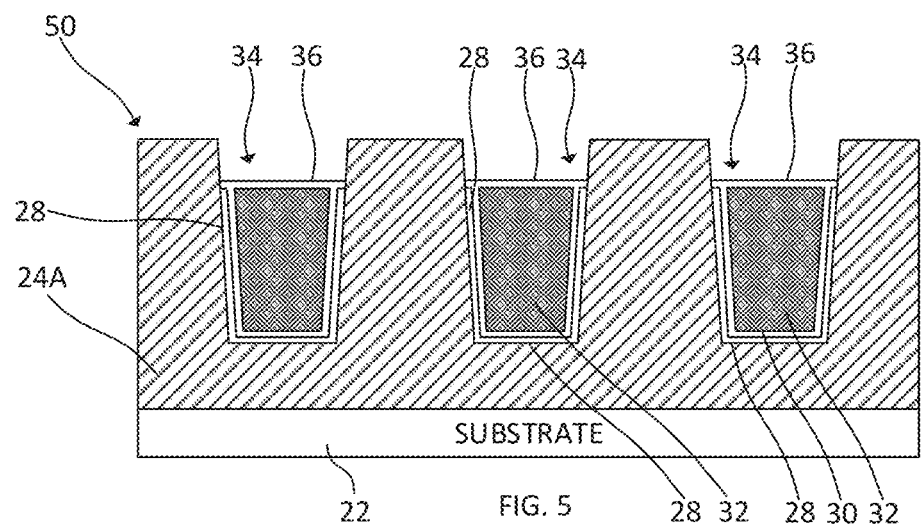
FIG. 5 is a schematic, cross-sectional view thereof following deposition of optional metal caps on the metal fill layer.

Optionally, a metal cap layer may be selectively deposited on the exposed top surfaces of metal interconnect lines within the trenches. Metals such as cobalt, ruthenium or manganese may be deposited using chemical vapor deposition or atomic layer deposition to form the metal cap layers. The metal cap layer may include multiple layers, such as Co/Ru. Post-deposition cleaning may be required to ensure there is no leakage or degradation resulting from possible metal residues on the resulting structure. A structure 50 as illustrated in FIG. 5 includes metal caps 36 on the recessed metal lines, and may be obtained following selective deposition of the metal cap layer. Recesses (shallow trenches) 34 within the dielectric layer 24A remain above the metal caps 36.

Figure 6:
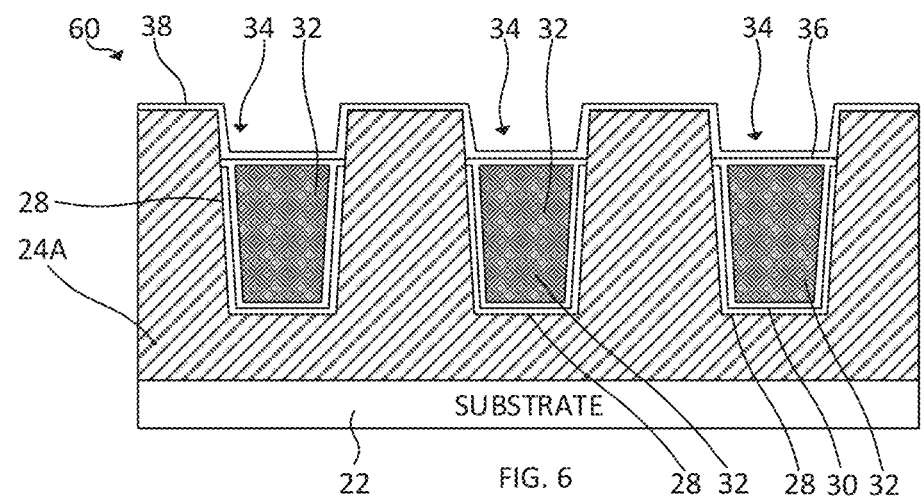
FIG. 6 is a schematic, cross-sectional view showing the structure of FIG. 5 following deposition of a conformal, dielectric etch stop layer.

Referring to structure 60 in FIG. 6, a dielectric etch stop layer 38 is formed on the structure shown in FIG. 4 or FIG. 5. This layer 38 can alternatively be referred to as a cap/etch stop layer. In the illustrated embodiment, the etch stop layer is formed over the structure 50 shown in FIG. 5. The etch stop layer may be conformally deposited using a suitable deposition technique, such as, for example, CVD, PECVD, RFCVD, PVD, ALD, MBD, PLD, and/or LSMCD, sputtering, and/or plating on the top and side wall surfaces of the ILD layer 24A and on the exposed top surfaces of the barrier layer 28, the metal liner 30 and the metal fill layer 32. The etch stop layer 38 may include, for example, silicon nitride (SiN), silicon carbide (SiC), silicon carbonitride (SiCN), hydrogenated silicon carbide (SiCH), silicon oxynitride (SiNO), silicon oxycarbide (SiOC), $AlO_x$, or other suitable material. The layer 38 may, for example, be a low-k silicon carbonitride material such as NBLOk™ material (mark of Applied Materials, Inc., Santa Clara, Calif., USA). This material includes Si, C, O, H, and N, and can be deposited using PECVD. The layer 38 can have a vertical thickness ranging from about 1 nm to about 30 nm. In some embodiments, the etch stop layer 38 is a multi-layer stack made of one or more of the materials identified above. The structure 60 as schematically illustrated in FIG. 6 can be obtained following conformal deposition of the etch stop layer.

Figure 7:
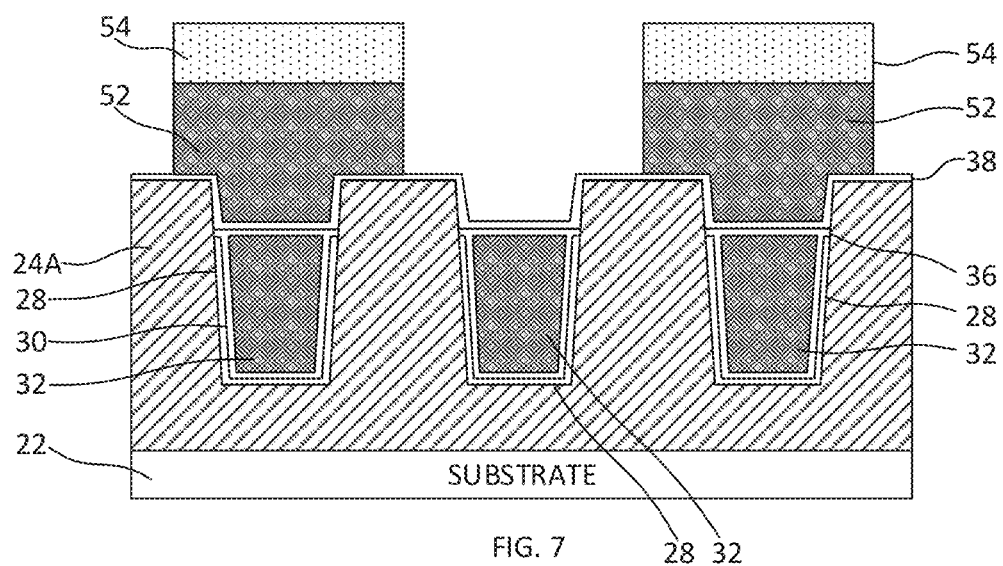
FIG. 7 is a schematic, cross-sectional view thereof following block mask deposition and patterning.

Referring to FIG. 7, a hard mask 52 is deposited on the structure 60 of FIG. 6 and patterned using a patterned photoresist layer 54. The patterned hard mask protects selected regions of the underlying structure, including portions of the etch stop layer 38 above selected metal lines and the ILD layer 24A. Other portions of the etch stop layer 38 are exposed, including some portions of the etch stop layer over the ILD layer 24A and over other ones of the metal lines therein. In the exemplary embodiment shown in the figure, the portion of the etch stop layer over the middle metal line is exposed. The hard mask 52 protects portions of the etch stop layer 38 above two of the illustrated metal lines. These two metal lines are later connected to vertical wiring as described further below.

Figure 8:
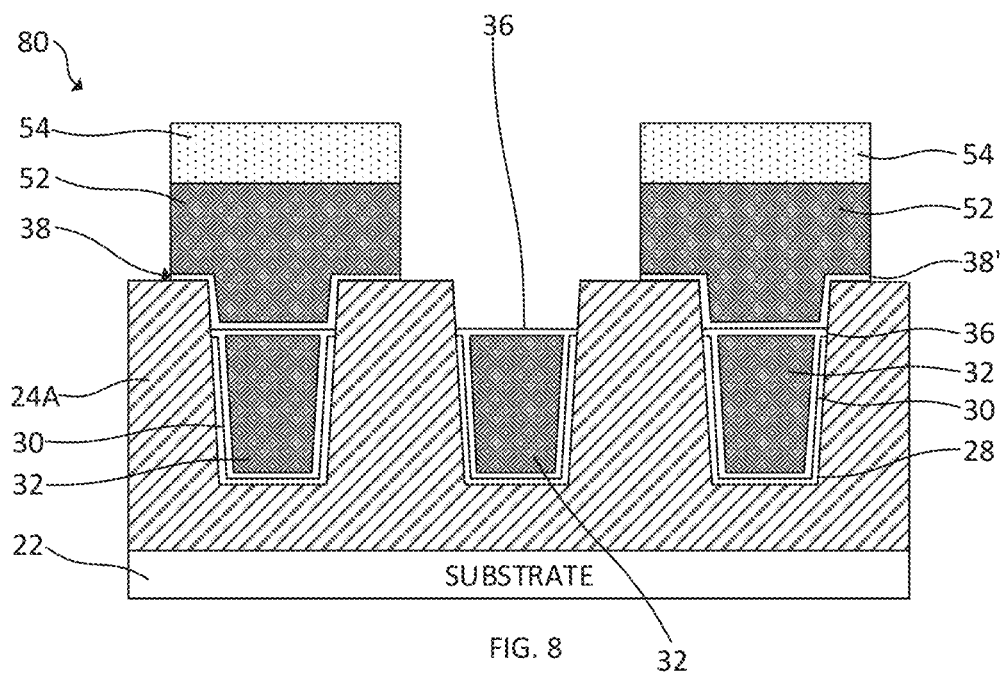
FIG. 8 is a schematic, cross-sectional view thereof following partial removal of the etch stop layer.
Figure 9:
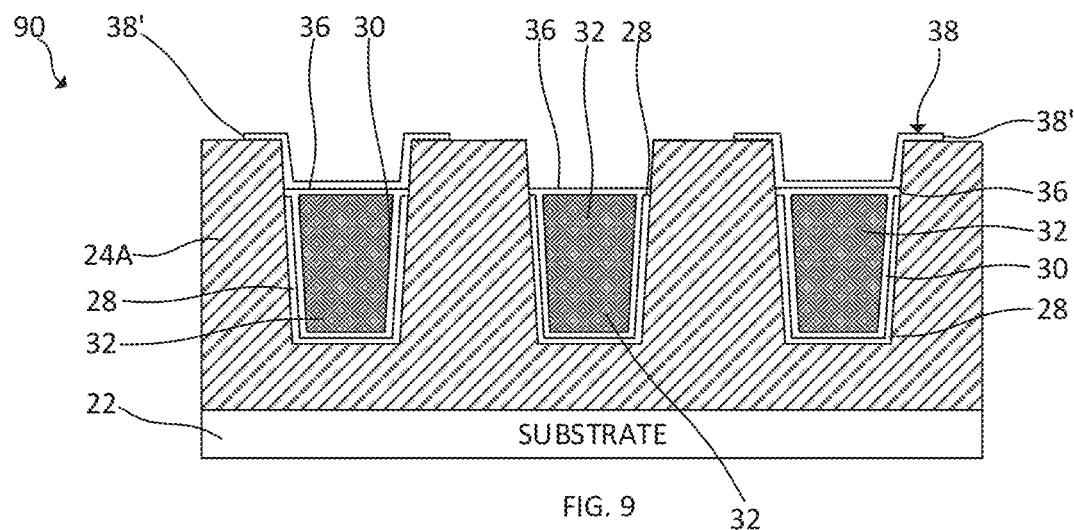
FIG. 9 is a schematic, cross-sectional view thereof following block mask removal.

The unprotected portions of the etch stop layer 38 are removed to obtain a structure 80 as schematically illustrated in FIG. 8. In embodiments wherein a silicon nitride or aluminum oxide etch stop layer is employed, it can be selectively removed using hot $H_3PO_4$ wet chemistry or other suitable process. Some top surfaces of the ILD layer 24A and the metal lines 32 are exposed following partial removal of the etch stop layer, while others remain intact. As shown in FIG. 8, the intact portions of the etch stop layer 38 form etch stop segments 38' that include horizontal cap portions extending over the metal lines. The segments 38' also include horizontal portions on the top surface of the ILD layer 24A and vertically extending portions lining the side walls of the trenches 34 (not numbered in FIG. 8) protected by the hard mask 52. The photoresist layer 54 and block mask 52 are then selectively removed to obtain a structure 90 as shown in FIG. 9. The etch stop segments 38' extend over those portions of the metal lines that are to be connected to wiring formed in a subsequently deposited, patterned, and metallized ILD layer, such as a metallized layer formed during BEOL processing.

Figure 10:
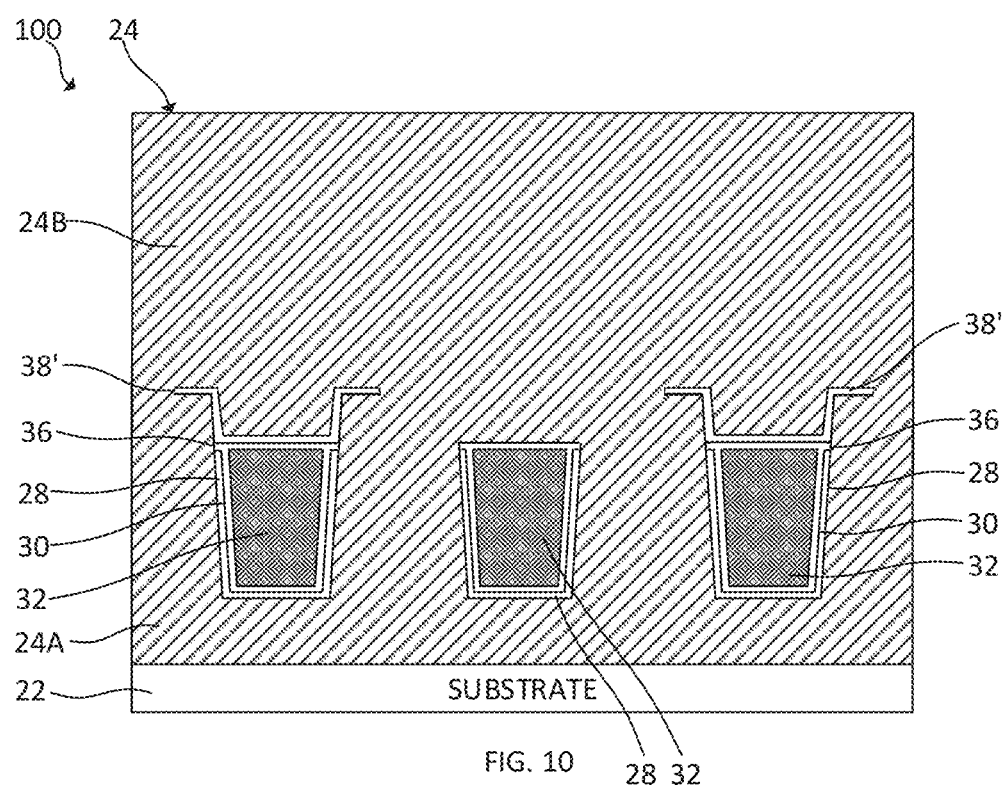
FIG. 10 is a schematic, cross-sectional view thereof following deposition of a top interlevel dielectric layer.

Referring to FIG. 10, a second or "top" interlevel dielectric (ILD) layer 24B is deposited over the structure 90, which embeds the etch stop segments 38' previously formed from the etch stop layer 38. A structure 100, as schematically illustrated in FIG. 10, is accordingly obtained. The second ILD layer 24B, like the earlier deposited interlayer 24A, preferably includes a low-k dielectric material. Deposition processes for ILD layer 24B should preferably have gap fill capability due to the underlying topography, e.g. ability to fill in the nanoscale trenches 34 (see FIG. 5; not numbered in FIG. 10) above the recessed metal lines within the first or bottom ILD layer 24A. In some embodiments, the top ILD layer 24B includes multiple dielectric layers including a first layer and a second layer. The first layer can be deposited using flowable ILD material(s) for filling the trenches 34. The second layer can have superior TDDB (time dependent dielectric breakdown) properties; for example, it can use SiCOH formed over the flowable dielectric material.

Either or both ILD layers 24A, 24B may, in some embodiments, include dielectric material having a dielectric constant approximating the present industry standard of 2.78 or alternatively an ultra low-k (ULK) dielectric material having a dielectric constant of 2.5 or below. Other dielectric materials appropriate for the ILD layers as employed herein may have dielectric constants in the range of 3 to 3.4. The bottom and top ILD layers 24A, 24B together form an integral ILD layer 24. Octamethylcyclotetrasiloxane (OMCTS) is a precursor that may be used in the chemical vapor deposition of dielectric layers having good TDDB properties. The ILD layer 24 may alternatively include a SiCN or a $SiO_2$ layer having good TDDB properties, with the nanoscale trenches 34 being filled with flowable dielectric material that may or may not have good TDDB properties.

Examples of low-k materials suitable for flowable dielectric material for filling nanoscale trenches include organosilicate glass (OSG), fluorine doped silicon dioxide, carbon doped silicon dioxide, porous silicon dioxide, porous carbon doped silicon dioxide, spin-on organic polymeric dielectrics (e.g., SiLK®), spin-on silicone based polymeric dielectric (e.g., hydrogen silsesquioxane (HSQ) and methylsilsesquioxane (MSQ), and combinations thereof. SiLK® thermosetting polymer may, for example, be applied by spin coating and may be planarized following curing. The flowable dielectric material may include spin-on glass (SOG) deposited using flowable chemical vapor deposition (FCVD). Spin on glass (SOG) compositions typically include silicon dioxide ($SiO_2$) and optionally dopants (either boron or phosphorous). SOG may be applied by spin-coating. Spin-coating is a process used to coat the deposition surface with material which is originally in the liquid form; the liquid is dispensed onto the deposition surface in a predetermined amount, and the wafer is rapidly rotated. For example, the deposition surface, e.g., substrate, may be rotated, i.e., spun, to speeds as great as 6,000 rpm. During spinning, liquid is uniformly distributed on the surface by centrifugal forces. The deposited material may then be solidified by a low temperature bake, e.g., baking at temperatures less than 200° C. A further exemplary low-k material with good gap fill properties is described in U.S. Pat. No. 9,412,581.

A flowable dielectric film can also include dielectric films that are formed from vapor-phase reactants and are flowable during deposition such as flowable chemical vapor deposition (FCVD). A substantially carbon-free silicon dioxide ($SiO_2$) material can, for example, be deposited using FCVD. Flowable chemical vapor deposition (FCVD) provides for a liquid-like film that flows freely into trench-like geometries to provide a bottom up, void-free and seam-free fill. Flowable chemical vapor deposition can fill gaps having relatively high aspect ratios exceeding 10:1. One example of a flowable chemical vapor deposition process is available from Applied Materials under the tradename Eterna FCVD system. Following deposition of a flowable dielectric material having good fill properties and possible curing, the resulting structure is then subjected to chemical mechanical planarization (CMP) down to the top surfaces of the etch stop layer 38. The remainder of the top ILD layer 24B can then be deposited using different dielectric materials and/or deposition techniques.

Figure 11:
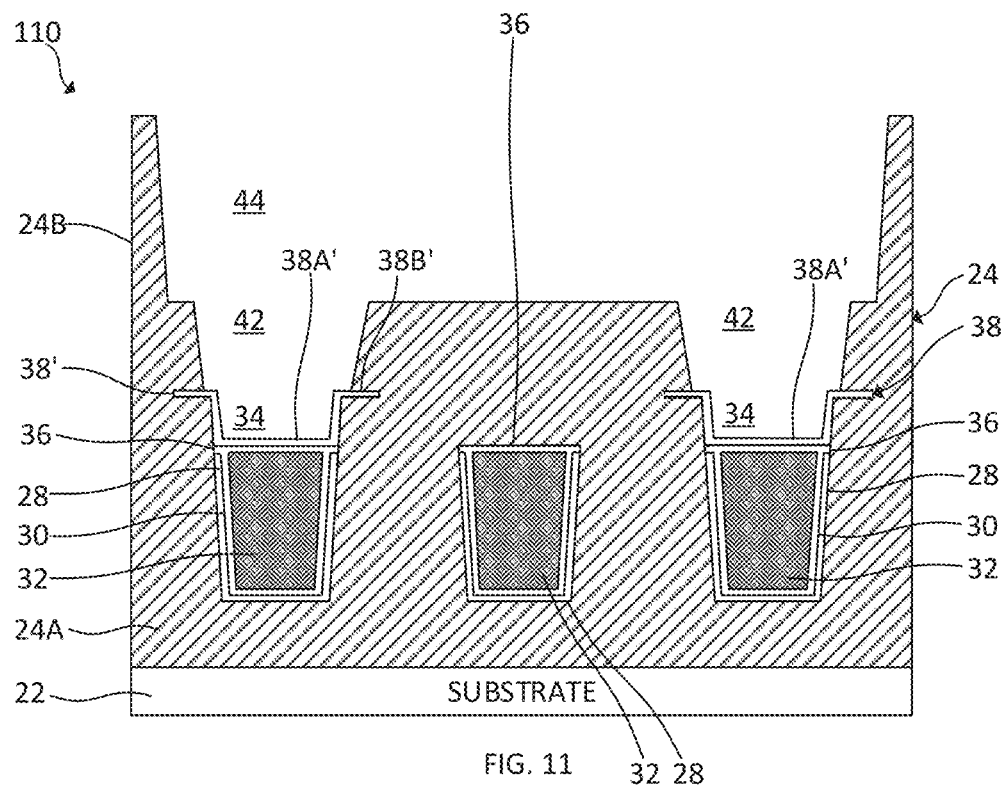
FIG. 11 is a schematic, cross-sectional view thereof following dual damascene patterning of the top dielectric layer.

Dual damascene patterning of the top ILD layer 24B is employed to form the exemplary structure 110 illustrated in FIG. 11. As known in the art, dual damascene patterning involves the deposition and patterning of hard masks (not shown) on the dielectric layer to be patterned. A trench pattern can be etched into one hard mask and a via pattern can be formed in another hard mask. The via pattern is aligned with selected portions of underlying metal lines to facilitate formation of fully aligned vias (FAVs). Using one of the hard masks, a selective etching technique is employed to form vias 42 extending vertically through selected portions of the dielectric layer 24. Trenches 44 in the top layer 24B of the dielectric layer 24 are formed using the other of the hard masks. The bottom portions of the trenches 44 adjoin the top openings of the vias 42. A dry etch (for example, a reactive ion etch (RIE)) may be employed to form such trenches and vias. The etching selectively removes portions of the ILD layer 24. The depth(s) of the trench openings can be controlled by using a timed etching process.

The selective etch further removes portions of the ILD layer 24 over the metal fill layer 32, causing the vias 42 formed within the top ILD layer 24B to extend vertically down to the portions of the etch stop segments 38' on the top surface of the bottom ILD layer 24A. The vias 42 may have diameters that exceed the widths of the trenches 34. The vias 42 may have bottom regions terminating at exposed, horizontal portions of the etch stop segments 38' that adjoin the open top ends of the shallow trenches 34. Outer horizontal portions 38B' of the etch stop segments 38' remain embedded within the dielectric layer 24 once dual damascene patterning thereof has been completed. Dielectric material within the trenches 34 and directly beneath the vias 42 is also removed to obtain the structure 110 as schematically illustrated in FIG. 11.

Still referring to FIG. 11, the bottom ends of the vertically extending vias 42 formed within the top dielectric layer 24B adjoin portions of the shallow trenches 34 above inner portions 38A' of the etch stop segments 38' on two of the three illustrated metal lines. The vias 42 and the portions of the trenches 34 from which dielectric (ILD) material has been removed form contiguous pathways from the trench 44 formed in the top ILD layer 24B. The shallow trench previously formed by recessing the metal line in the middle of the exemplary structure 110 remains filled by dielectric material. There is no via connecting the illustrated trench 44 to the middle metal line in the cross-sectional view. It will be appreciated that the structure 110 may include additional trenches (not shown) and one or more vias extending down to selected metal lines of the structure from each of the additional trenches. The trench(es) 44 within the ILD layer 24 may extend perpendicularly with respect to the metal lines formed in the bottom ILD layer 24A. The vias 42 connect the trenches 44, 34 formed in the top and bottom levels of the ILD layer 24.

Figure 12:
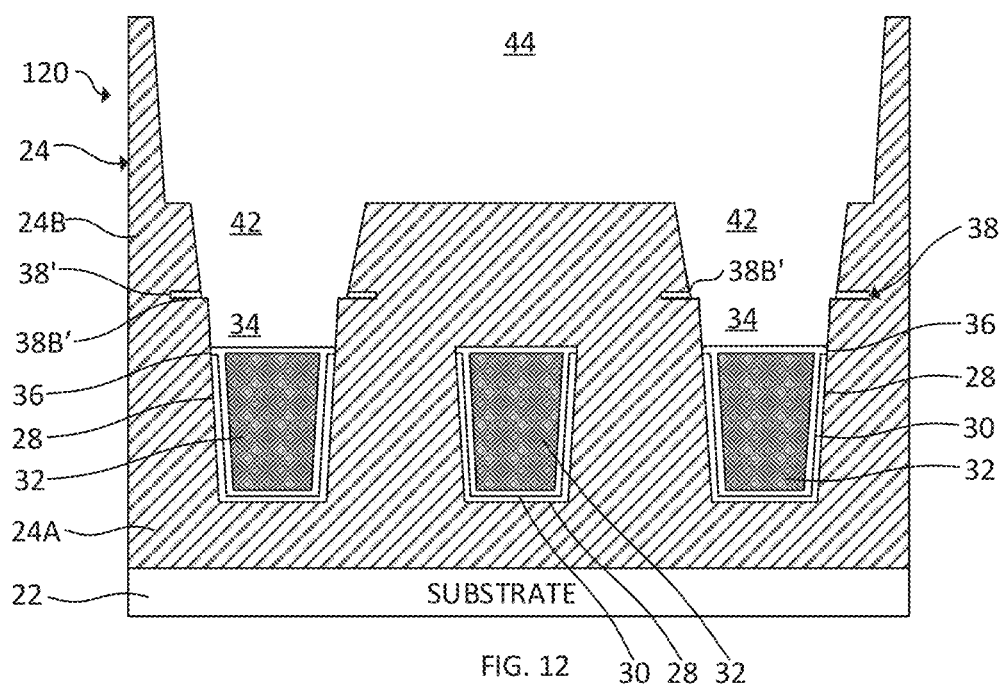
FIG. 12 is a schematic, cross-sectional view thereof following etching of exposed portions of the etch stop layer.

Following dual damascene patterning of the top ILD layer 24B, the exposed inner portions 38A' of the etch stop segments 38' are removed using a selective etch process. In embodiments wherein a silicon nitride etch stop layer is employed, it can be selectively removed using hot $H_3PO_4$ wet chemistry or other suitable process. A structure 120 as schematically illustrated in FIG. 12 can be obtained upon the selective removal of portions of the etch stop segments 38'. The top surfaces of portions of the metal lines that are vertically aligned with the vias 42 are exposed following removal of the etch stop layer from such top surfaces and removal of the optional metal caps if present. (Removal of such metal caps is shown with respect to the structure 130 of FIG. 13, discussed further below.) The bottom ends of the vias 42 within the top ILD layer 24B also adjoin portions of the top surfaces of the first ILD layer 24A following the partial removal of the etch stop segments 38'. Only small, horizontal portions of the originally deposited etch stop layer 38 remain embedded within the ILD layer 24. These remaining outer portions 38B' of the etch stop segments 38' extend laterally from the bottom ends of the vias 42, just above the top openings of the trenches 34. The etch stop layer segments within the structure 120 of FIG. 12 extend only around the vias 42 and only small lateral distances within the ILD layer 24. They accordingly should not contribute materially to added capacitance of the resulting structure (since the plate area in the capacitance formula is small compared to a case with a continuous etch stop layer). In some exemplary embodiments, the etch stop portions 38B' encircle the bottom ends of each of the vias 42 within the structure 120 and extend 20 nm or less within the ILD layer 24 from the via sidewalls. In one or more embodiments, the etch stop portions 38B' extend between five and ten nanometers (5-10 nm) laterally from the via sidewalls.

Figure 13:
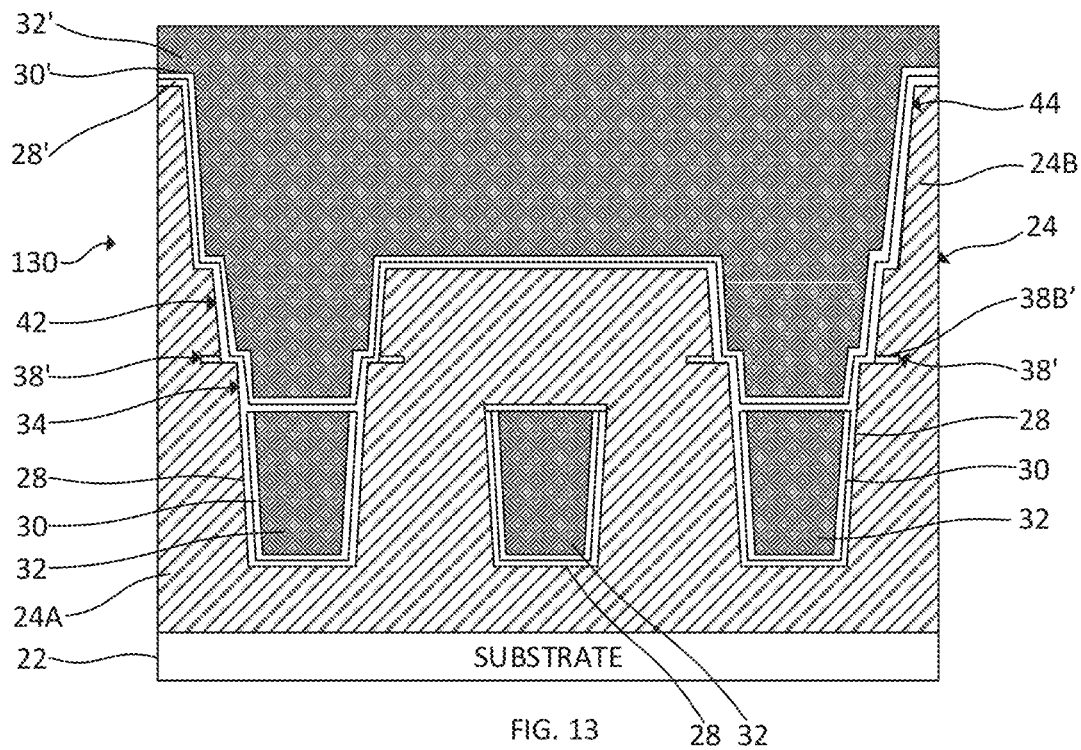
FIG. 13 is a schematic, cross-sectional view thereof following deposition of a barrier, a metal liner and metal filler.

Referring to FIG. 13, a further stage in the fabrication process includes depositing conformal, conductive layers of barrier and liner material to form a barrier layer 28' and an electrically conductive liner 30'. In some embodiments, the barrier layer 28' and the liner 30' include, respectively, the same materials as the previously formed barrier layer 28 and liner 30 within the first-deposited ILD layer 24A. The barrier layer 28' lines the sidewalls and bottom surfaces of the trenches 44, the sidewalls of the vias 42, and the exposed side walls of the trenches 34 directly beneath the vias 42. It further directly contacts the exposed surfaces of the metal lines 32 directly beneath the vias 42. In embodiments wherein metal caps 36 are formed on the metal lines, they are removed prior to deposition of the barrier layer and metal liner. The metal liner material 30' is deposited using known techniques such as CVD, ALD, or PVD, directly on the barrier layer 28'.

A thin copper (Cu) seed layer can be deposited over the surface of the metal liner 30' using PVD, followed by the electroplating of Cu to fill the dual damascene openings (trenches 44, vias 42) in the top ILD layer 24B, as well as the portions of the shallow trenches 34 in the bottom ILD layer 24A that are vertically aligned with the vias 42. A low-temperature thermal anneal (<200° C.) follows electroplating. A structure 130 as schematically illustrated in FIG. 13 may be obtained following deposition of the interconnect metal fill layer 32' and adjoining liner and barrier layers. The vias 42 containing the metal fill layer 32' are fully aligned vias (FAVs) electrically connected to selected underlying metal lines within the bottom ILD layer 24A.

The overburden barrier layer, metal liner, seed, and metallization materials are removed by a chemical mechanical polishing process (CMP) to planarize the surface of the structure down to the top surface of the ILD layer 24. Metal interconnect lines are thus formed within the trenches 44 of the dual damascene-patterned top portion 24B of the ILD layer 24. The metal interconnect lines within the trenches 44 run perpendicularly to the underlying metal interconnect lines within the trenches 26 of the bottom portion 24A of the ILD layer. The metal interconnect lines within the trenches 44 are electrically connected to one or more of the underlying metal interconnect lines by the interconnect metal within the vias 42.

Figure 14:
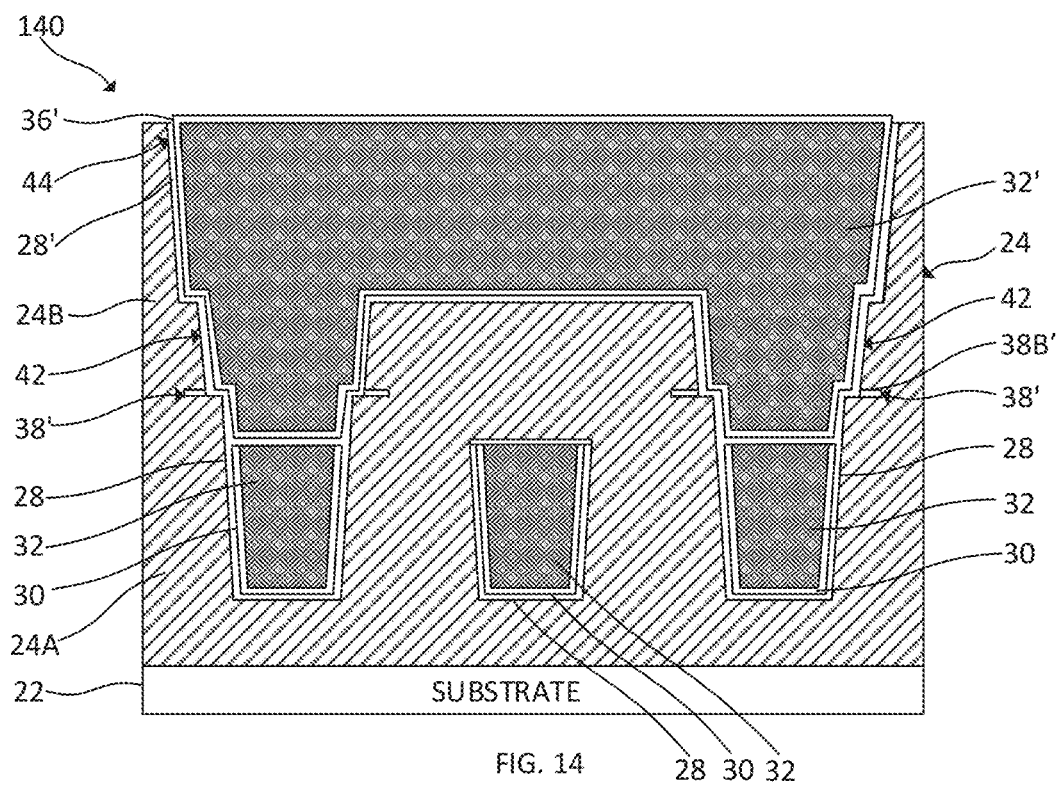
FIG. 14 is a schematic, cross-sectional view thereof following planarization of the barrier, metal liner and metal fill layer and deposition of a metal cap.

As seen in FIG. 14, a metal cap layer 36' may be selectively deposited on the exposed top surfaces of the metal interconnect lines formed within the trenches 44 from the interconnect metal fill layer 32'. For example, metals including, but not limited to, cobalt, ruthenium or manganese may be deposited using chemical vapor deposition or atomic layer deposition to form the metal cap layer 36'. In some embodiments, the metal cap layer includes materials immiscible with liquid copper, such as Ta or Ru. Post-deposition cleaning may be required to ensure that there is no leakage or degradation resulting from possible metal residues on the resulting structure. FIG. 14 schematically illustrates an exemplary monolithic structure 140 following planarization and metal cap deposition. It will be appreciated that additional interconnect layers (not shown) may be formed on the structure 140 using damascene or dual damascene techniques. One or more of the additional interconnect layers may include partially removed etch stop layers, where only discrete segments of the originally deposited layer remain following processing. Each of the discrete segments extend only around the vias and only short distances into the adjoining ILD layer from the via sidewalls.

The drawing figures as discussed above depict exemplary processing steps/stages in the fabrication of exemplary structures. Although the overall fabrication methods and the structures formed such methods are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling Pt Edition, Prentice Hall,* 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Thus, one method of forming an interconnect structure includes recessing metal lines 32 within a bottom interlevel dielectric layer 24A that is located above a semiconductor substrate 22. The recessing operation forms open-ended trenches 34 within the bottom interlevel dielectric layer and directly above the metal lines. The method further includes depositing a conformal dielectric etch stop layer 38 over the bottom interlevel dielectric layer and the metal lines. A structure as illustrated in FIG. 6 results, following deposition of the etch stop layer 38. Portions of the conformal dielectric etch stop layer are removed; the removing operation forms etch stop segments 38' from the conformal dielectric etch stop layer 38. The etch stop segments extend over a plurality of the metal lines and also over a top surface of the bottom interlevel dielectric layer, as schematically illustrated in FIGS. 8 and 9. A top interlevel dielectric layer 24B is formed (deposited) over the bottom interlevel dielectric layer 24A, the metal lines, and the etch stop segments 38' and is then subjected to dual damascene patterning.

As shown in FIG. 11, such patterning causes formation of one or more trenches 44 within the top dielectric layer 24B and one or more vias 42 extending downwardly from each of the one or more top trenches. The vias are vertically aligned with one or more portions of the open-ended trenches 34 and the metal lines beneath such trenches. Dual damascene patterning further results in partially exposing the etch stop segments 38'. Inner portions 38A' of the etch stop segments are exposed and outer portions 38B' of the etch stop segments remain unexposed between the bottom interlevel dielectric layer 24A and the top interlevel dielectric layer 24B. The exposed inner portions of the etch stop segments are removed to obtain a structure as exemplified in FIG. 12, followed by depositing interconnect metal within the one or more top trenches 44, the one or more vias 42, and the one or more portions of the open-ended trenches 34. A structure as shown in FIG. 13 may be obtained prior to removal of metal overburden. The interconnect metal is electrically connected to one or more of the metal lines within the first interlevel dielectric layer, and the outer portions of the etch stop segments extend laterally from the vias.

Another method includes depositing a conformal dielectric etch stop layer 38 over a top surface of a first interlevel dielectric layer 24A and a plurality of metal lines recessed within the first interlevel dielectric layer, such as shown in FIG. 6. A further step includes removing portions of the conformal dielectric etch stop layer, to expose regions of the top surface of the first interlevel dielectric layer 24A and one or more of the metal lines 32/36 as schematically illustrated in FIG. 8. Etch stop segments 38' are formed from the conformal dielectric etch stop layer 38 and extend over a plurality of the metal lines and portions of the top surface of the first interlevel dielectric layer 24A.

A second interlevel dielectric layer 24B is deposited over the first interlevel dielectric layer 24A, the metal lines, and the etch stop segments 38', as shown in FIG. 10, and subjected to dual damascene patterning. Such patterning forms one or more trenches 44 within the top dielectric layer, as well as downwardly extending vias 42. The vias 42 are vertically aligned with portions of the etch stop segments (and typically with the plurality of metal lines beneath the etch stop segments, such as shown in FIG. 11). The portions 38A' of the etch stop segments 38' that are vertically aligned with the vias are removed; the removal operation forms openings in the etch stop segments as schematically illustrated in FIG. 12. Interconnect metal 32' is then deposited within the trenches 44 and the vias 42. The interconnect metal extends through the openings in the etch stop segments and is electrically connected to one or more of the metal lines within the first interlevel dielectric layer. The trenches and vias may be lined with a barrier layer such as a TaN layer or a TiN layer prior to depositing an interconnect metal such as copper.

In some instances, structures obtained in accordance with the principles of the inventions described herein include a semiconductor substrate 22, and an interlevel dielectric layer 24 over the semiconductor substrate. The layer 24 includes a bottom level and a dual damascene patterned top level. The structure also includes metal lines 32 extending within the first level of the interlevel dielectric layer, and vertically extending vias 42 that are located within the dual damascene patterned second level of the interlevel dielectric layer and are aligned (e.g. vertically) with one or more of the metal lines. A metal interconnect layer 32' extends through the vertically extending vias 42 and is electrically connected to one or more of the metal lines 32. A dielectric etch stop layer 38 extends horizontally within the interlevel dielectric layer 24 and includes a plurality of discrete, coplanar etch stop segments 38' separated from each other by portions of the interlevel dielectric layer 24. Each of the metal-filled vias 42 extends, respectively, through an opening in one of the etch stop segments 38' as schematically illustrated in FIGS. 13 and 14.

Given the discussion thus far, and referring first to FIG. 6, it will be appreciated that, in general terms, an exemplary method of forming an interconnect structure, according to an aspect of the invention, includes depositing a conformal dielectric etch stop layer 38 over an initial structure including a substrate 22, a bottom interlevel dielectric layer 24A located outward of the substrate and defining a plurality of trenches 26 (seen in FIG. 1), and a plurality of metal lines 32 partially filling the trenches. Referring to FIG. 8, a further step includes removing portions of the conformal dielectric etch stop layer adjacent a first subset of the metal lines for which vias are not to be formed (e.g. the middle line in FIG. 8). The removal forms etch stop segments 38' from the conformal dielectric etch stop layer. The etch stop segments are located adjacent a second subset of the metal lines where vias are to be formed (e.g. the left- and right-hand lines in FIG. 8).

Referring to FIG. 10, a further step includes depositing a top interlevel dielectric layer 24B over the bottom interlevel dielectric layer, the metal lines, and the etch stop segments. Referring to FIG. 11, a still further step includes dual damascene patterning the top interlevel dielectric layer. This patterning forms one or more top trenches 44 within the top dielectric layer and one or more vias 42 extending downwardly from each of the one or more top trenches. The vias are vertically aligned with the second subset of the metal lines. Referring to FIG. 12, an even further step includes removing portions of the etch stop segments adjacent the second subset of the metal lines. Referring to FIG. 13, yet a further step includes depositing interconnect metal 32' within the one or more top trenches, the one or more vias, and the trenches containing the second subset of the metal lines. The interconnect metal is electrically connected to the second subset of the metal lines within the first interlevel dielectric layer 24A.

In one or more embodiments, in the dual damascene patterning step, inner portions 38A' of the etch stop segments are exposed and outer portions 38B' of the etch stop segments remain unexposed. The removal of the portions of the etch stop segments includes removing the exposed inner portions of the etch stop segments. The outer portions of the etch stop segments extend, for example, twenty nanometers or less from each of the one or more vias following removal of the exposed inner portions of the etch stop segments.

In one or more embodiments, referring to FIG. 7, forming the etch stop segments includes forming a patterned hard mask 52 on the etch stop layer; and selectively etching portions of the etch stop layer that are not covered by the patterned hard mask (thus obtaining the structure of FIG. 8).

Referring to FIG. 13, one or more embodiments further include conformally depositing electrically conductive barrier material 28' on the top interlevel dielectric layer, inner ends of the outer etch stop portions, and the second subset of the metal lines. In some instances, this barrier material is also deposited on a top surface of the bottom interlevel dielectric layer 24A.

As will be appreciated, forming the initial structure of FIG. 5 can be carried out by, as seen in FIG. 4, recessing an initial metal fill (seen in FIG. 3) that completely fills the trenches, so as to form the metal lines of FIG. 4 that partially fill the trenches. The trenches can each have an average width, w, of fifty nanometers or less.

In one or more embodiments, the outer portions 38B' of the etch stop segments extend five to ten nanometers from each of the one or more vias 42.

In one or more embodiments, in forming the initial structure, a conformal layer of barrier material 28 is included within the metal lines, adjoining the first interlevel dielectric layer 24A.

Referring to FIG. 6. in one or more instances, the recessing forms nanoscopic regions 34 above the metal lines 36 that partially fill the trenches 26, and the second interlevel dielectric layer 24B is caused to fill the nanoscopic regions, as seen in FIG. 10.

Referring to FIG. 13, one or more embodiments include lining the one or more top trenches, those of the nanoscopic regions associated with the second subset of the metal lines (left- and right-hand), the vias, and portions of the top surface of the first interlevel dielectric layer with an electrically conductive barrier material 30'.

Furthermore, referring to FIG. 14, given the discussion thus far, it will be appreciated that an exemplary structure, according to an aspect of the invention, includes a semiconductor substrate 22 and an interlevel dielectric layer 24 over the semiconductor substrate. The interlevel dielectric layer includes a bottom level 24A and a top level 24B above the bottom level. Also included are first and second subsets of metal lines 32 extending within the bottom level of the interlevel dielectric layer. The first subset of lines (e.g. middle line) are not associated with vias while the second subset (e.g., left- and right-hand lines) are associated with vias. It is to be understood that such association with vias is within the particular cross-section seen in the figures.

Also included are vertically extending vias 42, located within the top level of the interlevel dielectric layer, and aligned with the second subset of the metal lines; as well as a metal interconnect layer 32' extending through the vertically extending vias and electrically connected to the second subset of the metal lines. The structure further includes a plurality of discrete etch stop segments 38B' separated from each other by portions of the interlevel dielectric layer. Each of the vias extends, respectively, through an opening in one of the etch stop segments. The etch stop segments are adjacent the second subset of the metal lines but not the first subset of the metal lines.

In one or more embodiments, the dielectric etch stop layer extends horizontally within the interlevel dielectric layer, and horizontal step portions are formed by the bottom level of the interlevel dielectric layer and a bottom end of each of the vias (inverted hat-shaped portions over left- and right-hand metal lines in FIG. 14). Each of the etch stop segments 38B' extends laterally from the horizontal step portions.

One or more embodiments further include a conformal layer of electrically conductive barrier material 28' lining the vias and the horizontal step portions.

In some cases, each of the etch stop segments extends less than twenty nanometers laterally beyond each of the vias; in some cases, each of the etch stop segments extends between five and ten nanometers laterally beyond each of the vias. In some embodiments, each of the etch stop segments, respectively, completely encircles one of the vias.

In one or more instances, the interlevel dielectric layer comprises one or more low-k dielectric materials and the dielectric etch stop layer comprises AlOx, SiN, SiC, SiCN, SiNO, SiCO or combinations thereof.

Even further, given the discussion thus far, an exemplary method includes encoding, into a design structure embodied on a non-transitory computer-readable medium, a design for an integrated circuit. The design structure specifies a design for an exemplary structure as discussed above. The method further includes specifying, within the design structure, a horizontal extent for the discrete etch stop segments which limits parasitic capacitance of the discrete etch stop segments to no more than a predetermined capacitance value; specifying, within the design structure, a distance between the vertically extending vias and the first subset of the metal lines, which enhances breakdown voltage to at least a predetermined minimum voltage value; and specifying, within the design structure, a contact area between the vias and the second subset of metal lines which limits via resistance to no more than a predetermined resistance value.

Figure 15:
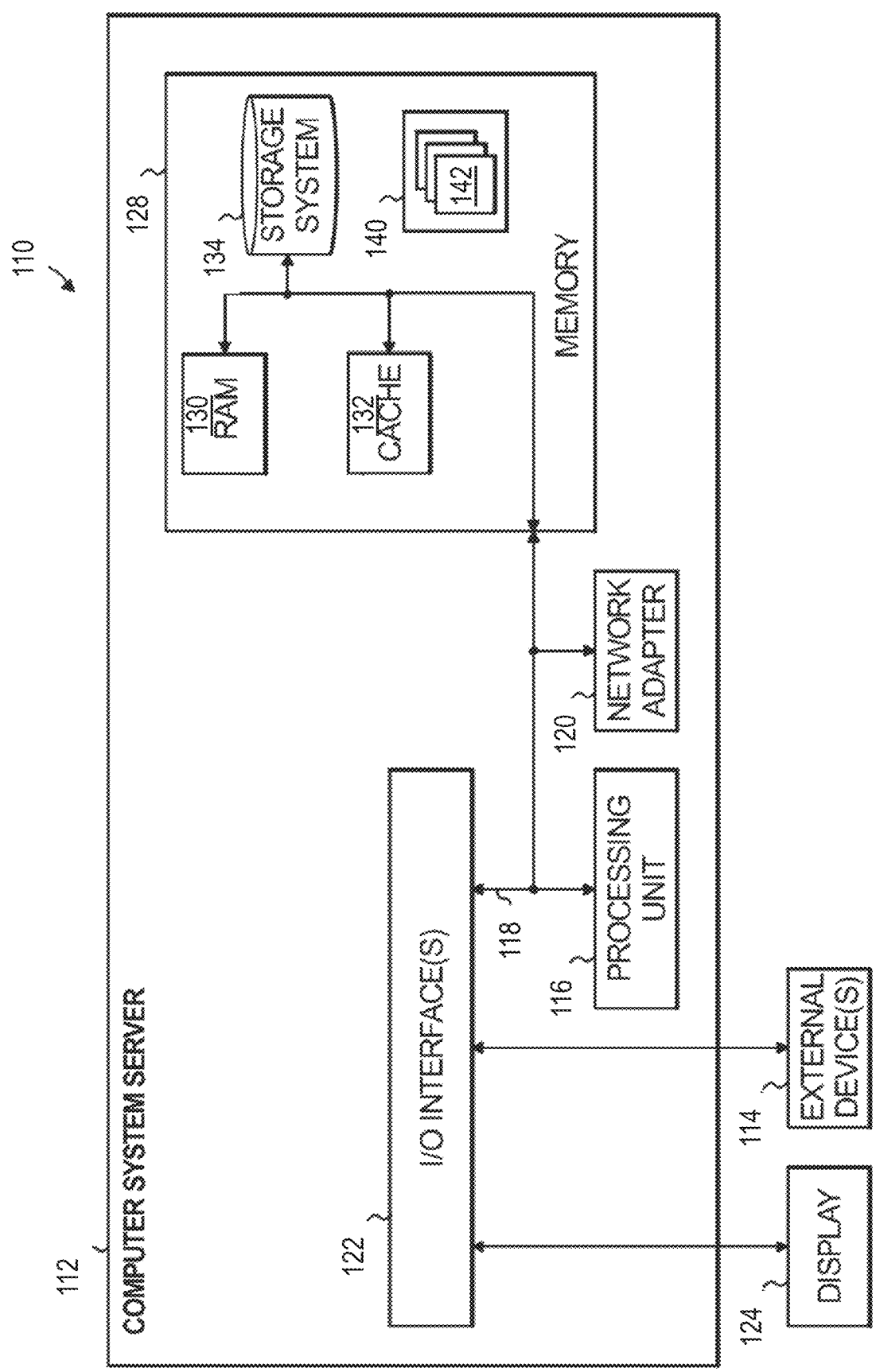
FIG. 15 depicts a computer system that may be useful in implementing one or more aspects and/or elements of the invention.
Figure 16:
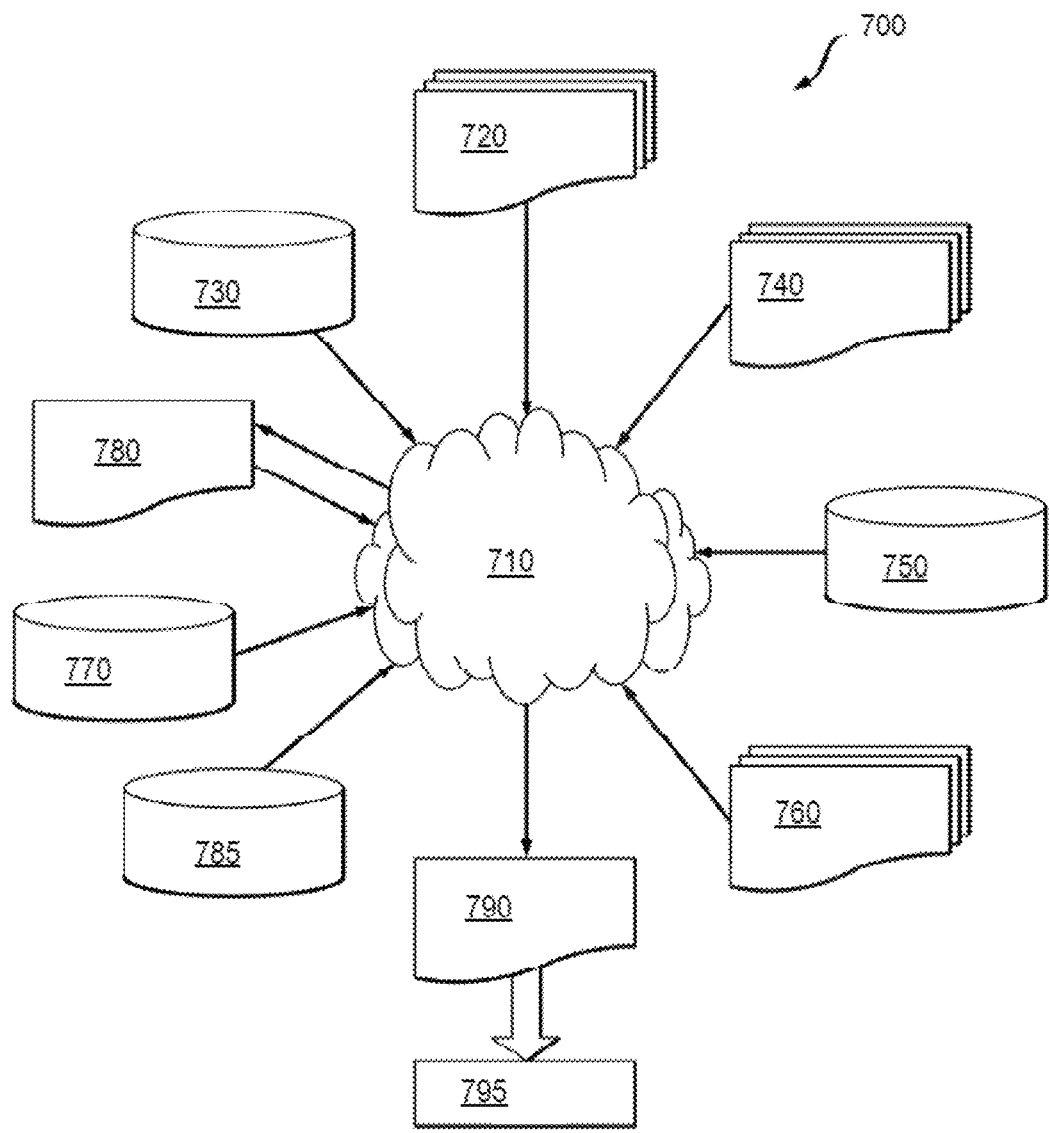
FIG. 16 is a flow diagram of a design process used in semiconductor design, manufacture, and/or test.

The predetermined capacitance value, predetermined minimum voltage value, and predetermined resistance value can be determined using, for example, techniques of Electronic Design Automation (EDA). Reference is made to FIG. 16 and accompanying text below. The design structure can be provided, for example, to a foundry over a network (e.g., via network adapter 120 discussed below with regard to FIG. 15). One or more embodiments further include fabricating an integrated circuit in accordance with the design structure.

Some aspects of the invention (e.g. a design process as discussed below) can be implemented in part using an apparatus including a memory and at least one processor that is coupled to the memory and operative to perform exemplary method steps (and/or control semiconductor fabrication equipment to carry out such steps). FIG. 15 depicts a computer system that may be useful in implementing one or more aspects and/or elements of the invention; it is referred to herein as a cloud computing node but is also representative of a server, general purpose-computer, etc. which may be provided in a cloud or locally.

In cloud computing node 110 there is a computer system/server 112, which is operational with numerous other general purpose or special purpose computing system environments or configurations. Examples of well-known computing systems, environments, and/or configurations that may be suitable for use with computer system/server 112 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 112 may be described in the general context of computer system executable instructions, such as program modules, being executed by a computer system. Generally, program modules may include routines, programs, objects, components, logic, data structures, and so on that perform particular tasks or implement particular abstract data types. Computer system/server 112 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 15, computer system/server 112 in cloud computing node 110 is shown in the form of a general-purpose computing device. The components of computer system/server 112 may include, but are not limited to, one or more processors or processing units 116, a system memory 128, and a bus 118 that couples various system components including system memory 128 to processor 116.

Bus 118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 112 typically includes a variety of computer system readable media. Such media may be any available media that is accessible by computer system/server 112, and it includes both volatile and non-volatile media, removable and non-removable media.

System memory 128 can include computer system readable media in the form of volatile memory, such as random access memory (RAM) 130 and/or cache memory 132. Computer system/server 112 may further include other removable/non-removable, volatile/non-volatile computer system storage media. By way of example only, storage system 134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 118 by one or more data media interfaces. As will be further depicted and described below, memory 128 may include at least one program product having a set (e.g., at least one) of program modules that are configured to carry out the functions of embodiments of the invention.

Program/utility 140, having a set (at least one) of program modules 142, may be stored in memory 128 by way of example, and not limitation, as well as an operating system, one or more application programs, other program modules, and program data. Each of the operating system, one or more application programs, other program modules, and program data or some combination thereof, may include an implementation of a networking environment. Program modules 142 generally carry out the functions and/or methodologies of embodiments of the invention as described herein.

Computer system/server 112 may also communicate with one or more external devices 114 such as a keyboard, a pointing device, a display 124, etc.; one or more devices that enable a user to interact with computer system/server 112; and/or any devices (e.g., network card, modem, etc.) that enable computer system/server 112 to communicate with one or more other computing devices. Such communication can occur via Input/Output (I/O) interfaces 122. Still yet, computer system/server 112 can communicate with one or more networks such as a local area network (LAN), a general wide area network (WAN), and/or a public network (e.g., the Internet) via network adapter 120. As depicted, network adapter 120 communicates with the other components of computer system/server 112 via bus 118. It should be understood that although not shown, other hardware and/or software components could be used in conjunction with computer system/server 112. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 15, such an implementation might employ, for example, a processor 116, a memory 128, and an input/output interface 122 to a display 124 and external device(s) 114 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 130, ROM (read only memory), a fixed memory device (for example, hard drive 134), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 116, memory 128, and input/output interface 122 can be interconnected, for example, via bus 118 as part of a data processing unit 112. Suitable interconnections, for example via bus 118, can also be provided to a network interface 120, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 116 coupled directly or indirectly to memory elements 128 through a system bus 118. The memory elements can include local memory employed during actual implementation of the program code, bulk storage, and cache memories 132 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 120 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 112 as shown in FIG. 15) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 116. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary System and Article of Manufacture Details

Some aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

One or more embodiments integrate the characterizing and simulating techniques herein with semiconductor integrated circuit design simulation, test, layout, and/or manufacture. In this regard, FIG. 16 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc. Improved latch tree synthesis can be performed as described herein.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc. In some instances, the following flow occurs: design house tape-out→foundry tape-out (retargeting can happen here)→mask shop→manufacturing. A design house can be a company without foundry capability; a mask shop can be a third company, different than the foundry and design house. Manufacturing is also handled at the foundry that does the retargeting, in one or more embodiments. Before the foundry tapes out, the design house may sometimes get a chance to review retargeting and react with an updated tape-out. This may be handled by smaller circuit blocks that were sent to the foundry for analysis before either tape-out. It may also happen, in some cases, if tape-out is staggered across various layers of the chip. Staggering occurs, for example, where only a few layers are taped-out while others are still being worked on and are thus subject to update if pertinent retargeting issues are known.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having structures including interconnects and associated structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below", "top" and "bottom", and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of forming an interconnect structure, comprising:
    depositing a conformal dielectric etch stop layer over an initial structure including a substrate, a bottom interlevel dielectric layer located outward of the substrate and defining a plurality of trenches, and a plurality of metal lines partially filling the trenches;
    removing portions of the conformal dielectric etch stop layer adjacent a first subset of the metal lines for which vias are not to be formed, the removing of the portions forming etch stop segments from the conformal dielectric etch stop layer, the etch stop segments being located adjacent a second subset of the metal lines where vias are to be formed;
    depositing a top interlevel dielectric layer over the bottom interlevel dielectric layer, the metal lines, and the etch stop segments;
    dual damascene patterning the top interlevel dielectric layer, the patterning of the top interlevel dielectric layer forming one or more top trenches within the top interlevel dielectric layer and one or more vias extending downwardly from each of the one or more top trenches and being vertically aligned with the second subset of the metal lines;
    removing portions of the etch stop segments adjacent the second subset of the metal lines; and
    depositing interconnect metal within the one or more top trenches, the one or more vias, and the trenches containing the second subset of the metal lines, the interconnect metal being electrically connected to the second subset of the metal lines within the bottom interlevel dielectric layer.

2. The method of claim 1, wherein:
    in the dual damascene patterning step, inner portions of the etch stop segments are exposed and outer portions of the etch stop segments remain unexposed, and
    the removing of the portions of the etch stop segments comprises removing the exposed inner portions of the etch stop segments, the outer portions of the etch stop segments extending twenty nanometers or less from each of the one or more vias following removal of the exposed inner portions of the etch stop segments.

3. The method of claim 2, further comprising conformally depositing electrically conductive barrier material on the top interlevel dielectric layer, inner ends of the outer portions of the etch stop segments, and the second subset of the metal lines.

4. The method of claim 3, further comprising depositing the electrically conductive barrier material on a top surface of the bottom interlevel dielectric layer.

5. The method of claim 4, further comprising forming the initial structure by recessing an initial metal fill that completely fills the plurality of trenches defined by the bottom interlevel dielectric layer, thereby forming the metal lines, the plurality of trenches defined by the bottom interlevel dielectric layer each having an average width of fifty nanometers or less.

6. The method of claim 5, wherein the outer portions of the etch stop segments extend five to ten nanometers from each of the one or more vias.

7. The method of claim 6, wherein forming the initial structure further comprises including a conformal layer of barrier material, within the metal lines, adjoining the bottom interlevel dielectric layer.

8. The method of claim 5, wherein the recessing forms nanoscopic regions above the metal lines that partially fill the plurality of trenches defined by the bottom interlevel dielectric layer, further comprising causing the top interlevel dielectric layer to fill the nanoscopic regions.

9. The method of claim 8, further comprising lining the one or more top trenches, those of the nanoscopic regions associated with the second subset of the metal lines, the vias, and portions of the top surface of the bottom interlevel dielectric layer with an electrically conductive barrier material.

10. The method of claim 1, wherein forming the etch stop segments comprises:
 forming a patterned hard mask on the conformal dielectric etch stop layer; and
 selectively etching portions of the conformal dielectric etch stop layer uncovered by the patterned hard mask.

* * * * *